United States Patent [19]

Zirbes et al.

[11] Patent Number: 5,025,550
[45] Date of Patent: Jun. 25, 1991

[54] AUTOMATED METHOD FOR THE MANUFACTURE OF SMALL IMPLANTABLE TRANSPONDER DEVICES

[75] Inventors: Glen L. Zirbes, Silver Lake; Leonard D. Hadden, Minneapolis, both of Minn.; Philip R. Troyk, Morton Grove, Ill.

[73] Assignee: Trovan Limited, Isle of Man, United Kingdom

[21] Appl. No.: 530,047

[22] Filed: May 25, 1990

[51] Int. Cl.$^5$ .............................................. H01F 41/02
[52] U.S. Cl. ........................................ 29/605; 29/827
[58] Field of Search ............... 29/605, 840, 827, 602.1

[56] References Cited

U.S. PATENT DOCUMENTS

4,860,433 8/1989 Minva ................................... 29/605

Primary Examiner—Carl E. Hall
Attorney, Agent, or Firm—Rosenblum, Parish, Bacigalupi

[57] ABSTRACT

An improved automated method for the manufacture of small implantable passive transponder devices is presented in which semiconductor wafer die are bonded to a conductively coated tape leadframe. This tape, with die attached, is injected molded to form a cap around the leads and the attached die, such that the exposed portion of the leads extend laterally from the cap. A ferrite core is attached to the base of the cap, and a fine coil wire, dispensed from a specially designed applicator, is automatically bonded to one of the leads protruding from the cap body. The wire is subsequently wound around the ferrite core and terminated by automatic attachment to another of the protruding leads. The assembled device is thereafter encapsulated within a small glass housing.

19 Claims, 5 Drawing Sheets

AUTOMATED METHOD FOR THE MANUFACTURE OF SMALL IMPLANTABLE TRANSPONDER DEVICES

BACKGROUND OF THE INVENTION

1. Field of the Invention

The present invention relates generally to the production of small transponder devices, and more particularly to a fully automatized method for manufacturing small passive transponder devices suitable for fitting into a small implantable capsule, including high speed automated core winding and fully automated wire-to-lead termination.

2. Brief Description of the Prior Art

Transponders have been used for identification purposes for many years, especially in the detection and identification of livestock. Passive transponders are usually self-contained implantable devices which are designed to have a longer useful lifetime than the lifespan of the animal in which they are implanted.

A fundamental component of the transponder device is a semiconductor chip or die which contains the identification information. This chip is coupled to an induction coil which enables the transponder to receive and utilize incident electromagnetic wave energy for power and to retransmit electromagnetic response signals. Initially, an operator, using a hand-held or other type of transmitter/reader, directs a beam of energy toward the implanted transponder. This energy, usually in the form of an electromagnetic radio wave, induces a current in the induction coil which charges a minute capacitor or similar energy storage component. After being energized, the transponder device subsequently discharges the stored energy in the form of an electromagnetic wave which carries the identification information to an appropriate receiver, thus enabling identification of the transponder device carrier.

Because it is necessary for these devices to be implantable, there are inherent size restrictions that must be considered in their design and manufacture. For example, an element of most passive transponders is a ferrite core, around which a fine copper wire must be wound. This wire typically has a diameter of only a few microns, and is thus quite difficult to manipulate with precision and care, even manually. Consequently, prior art methods of manufacture require a relatively slow core winding speed, and manual bonding of the wire ends directly to the integrated circuit substrate. Thus, operator attention and interaction is continuously required to ensure the proper handling and connection of the delicate core wire. This is very costly, especially in terms of lost production time and the labor expense involved in constantly employing the highly trained technicians necessary for device assembly.

Another difficulty in the efficient production of these devices relates to the method used in encapsulating the semiconductor chip to which the fine core wire is attached. The usual method is to use a transfer molding process so that the delicate wires connecting the silicon die to the electrical connections on the leadframe are not disturbed or damaged. Transfer molding, however, involves a relatively lengthy cycle time, and thus an additional delay to the total production time necessary for the manufacture of the transponders is incurred.

SUMMARY OF THE INVENTION

It is, therefore, an object of the present invention to provide a method for manufacturing small passive transponder devices which is fully automated.

It is another object of the present invention to provide a method of the type described wherein the die is attached to a leadframe without the use of fine wires, thus allowing for the more efficient and faster method of injection molding for encapsulation of the lead-die assembly.

It is another object of the present invention to provide a method of the type described wherein the total core winding time is substantially shortened.

It is a further object of the present invention to provide a method of the type described wherein the ends of the fine wire used for core winding can be terminated by conductive coupling to the integrated circuit without operator intervention.

Briefly, these and other objects of the present invention are achieved by using a novel, fully automated method for manufacture of manufacturing and assembling small passive transponder devices. Initially, a wafer, including individual chips having encoded identification information, is "bumped" to allow direct wireless connection of the chips to a leadframe. This connection is facilitated by coating the leadframe with a thick solder plating and providing augmented frame leads for enhanced surface area and bonding contact potential. The leadframe with the die attached is injection-molded such that a cap is formed around the lead-die assembly portion of the leadframe and further such that the thickly coated augmented leads project laterally outward from the cap. A ferrite core is attached to the base of the cap and subsequently wound with a fine copper wire. The ends of the wire are terminated on the protruding leads via automatic thermal bonding and the completed device is thereafter encapsulated in a minute glass housing.

The above delineated objects as well as other objects of the present invention will no doubt become apparent to those of ordinary skill in the art after having read the following detailed description of the preferred embodiments illustrated in the several figures of the drawing.

DETAILED DESCRIPTION OF THE PREFERRED EMBODIMENT

Figure 1:
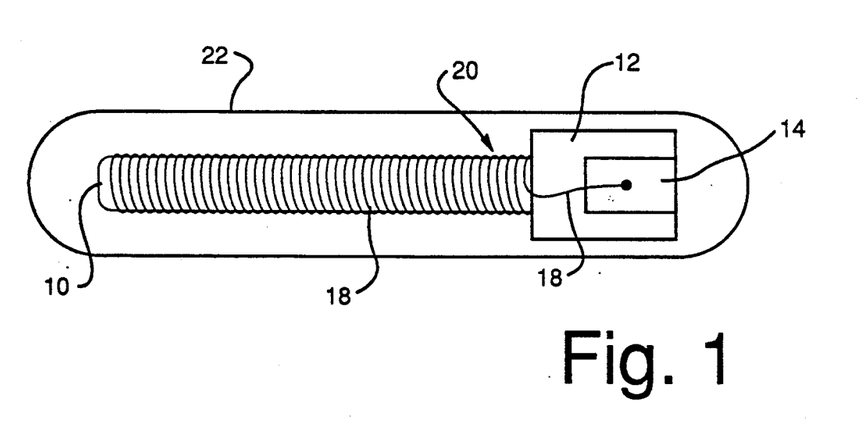
FIG. 1 is an elevational view of the assembled and encapsulated transponder device produced in accordance with the method of the present invention.

Referring now to FIG. 1, shown is a fully assembled and encapsulated transponder device made in accordance with the method of the present invention. The capsule typically has a diameter of 1.2-1.8 mm and can be even smaller using the present method. To achieve a corresponding small diameter a longitudinal construction technique is employed. A cylindrical core 10, normally ferrite, is attached to a cap 12, normally formed from a thermoplastic molding composition. The cap houses a semiconductor chip (not shown) which has been conductively attached to a tape leadframe 24 (also not shown). A first lead 14 and a second lead 16 (opposite lead 14, and not shown in FIG. 1), project laterally outward from the sides of cap 12, and are bent upwards or downwards toward these sides. The leads shown in FIG. 1 have been bent upwards toward the top end of cap 12, and were once integral components of leadframe 24 (shown in FIG. 2 and described in detail below). An ultrafine conductive wire 18 is wound around core 10, and the ends of the wire are attached to the surface of leads 14 and 16. The fully assembled transponder 20 is encapsulated in a housing 22, which is normally composed of glass.

Figure 2:
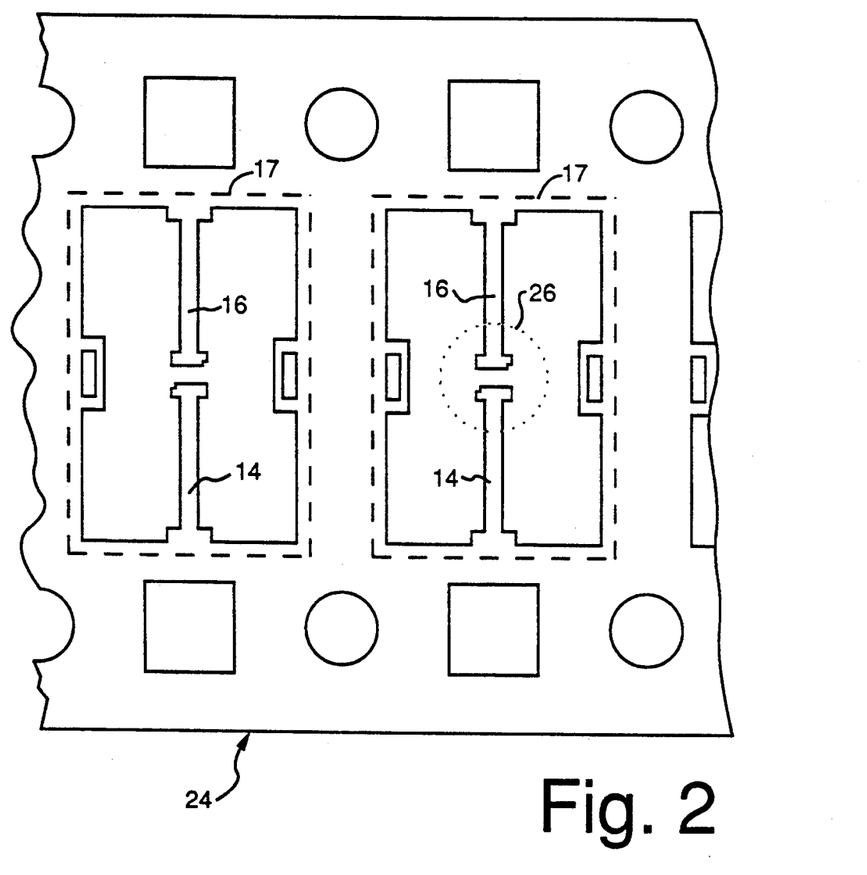
FIG. 2 is a top plan view of the specially designed and coated leadframe used in the production of the transponder device in accordance with the method of the present invention.

A preliminary step, integral to the production of transponder 20 in accordance with the method of the present invention, is the construction and preparation of an appropriate leadframe 24. Referring to FIG. 2, shown is a section of tape leadframe 24 used in the manufacture of transponder 20 in accordance with the method of the present invention. Leadframe 24 normally includes a plurality of individual assembly sites 17, each of which provide the two augmented leads 14 and 16. The surface of leadframe 24 is specially treated with a relatively thick coating of conductive solder. In the preferred embodiment, this coating is approximately 600 micro-inches of 60/40 tin-lead solder. Leads 14 and 16 are augmented to provide an increased surface area to facilitate automated electrical connections thereto.

Another preliminary step, which facilitates the production of the transponder 20 in accordance with the method of the present invention, is the preparation of the wafer containing the individual semiconductor chips or die used to permanently store and relay the pertinent identification information. The wafers undergo a process known as "wafer bumping" in which relatively large conductive bumps are produced on the surface of the exposed contact pads of the individual die. This wafer bumping process is a commonly used method of providing raised bonding areas on the contact pads of a semiconductor chip, generally used in the industry for gang bonding to tape leadframes.

The bumping process begins with a completed wafer containing exposed aluminum or gold bonding pads. The rest of the circuit is protected with nitride, glass, or oxinitride for scratch protection. The wafers are first coated in a sputtering operation with about 1200 angstroms of a titanium-tungsten alloy, and about 1200 angstroms of pure gold. After completion of the sputtering operation, the wafers are coated with about 30 microns of photo-resist, and patterned with a "bump" mask to open windows in this photo-resist over the above-described contact pads. This pattern is developed and descummed in an RF-oxygen plasma, cured, and backcoated with a polymer to prevent plating everywhere except where the bumps are desired.

The patterned and protected wafers are then immersed in a gold plating solution, through which a predetermined and controlled plating current is applied, to plate bumps in the previously formed windows. The size of these bumps is in the order of 20 to 24 microns. After the plating is completed, the photo-resist is removed, the sputtered field gold is removed (using a cyanide based etchant), and the field titanium-tungsten is removed (using peroxide). Occasionally, an alloy step is required at this point in order to dissolve the native aluminum oxide into the titanium-tungsten. This is usually done for about 30 minutes at a temperature in the range of 350 to 450 degrees centigrade.

Figure 3A:
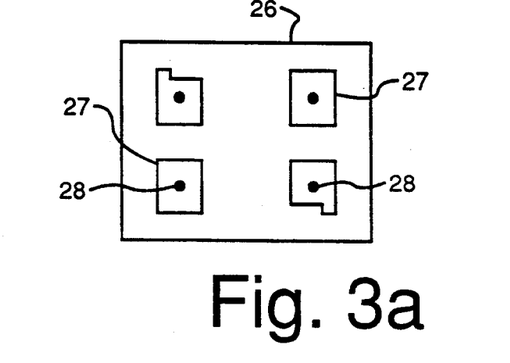
FIG. 3a is a top plan view of an individual die which has been "bumped" in accordance with the method of the present invention.

Shown in FIG. 3a is an exemplary single die 26 with contact pads 27 and gold bumps 28 provided on the surface thereof, in accordance with the above-described process. Die 26 contains the identification information necessary to purposeful operation of the transponder device, and the bumps 28 facilitate the direct coupling of the die to leads 14 and 16 of leadframe 24, as described below.

The next step in accordance with the method of the present invention is mounting the bumped wafers on glass slides, prior to cutting the wafers into individual die. More specifically, the wafers, processed as described above, are mounted to glass slides using a special high-temperature wax compound. This allows the wafers to be temporarily affixed to the glass slides, and facilitates easy separation, as described below, when the individual die are presented for mounting on the lead tape. At this point, the wafers are ready for dicing, normally by use of a diamond dicing blade or saw.

Once the die 26 and leadframe 24 have been prepared as described above, the fully diced wafer is presented to the bonder, still attached, via the wax, to the glass plate. The specially coated leadframe, in tape format, is also presented to the bonder. In one alternative to the method of the present invention, the tape 24 is automatically aligned with the die bumps 28 using an automated pattern-recognition video system. In a second alternative to the method of the present invention, this alignment is semi-automatic, with the operator viewing the alignment through a video system and making the fine adjustments prior to bonding.

When bump-to-lead alignment is complete, a heated diamond thermode automatically descends, at a predetermined rate and in a predetermined pattern, contacting a lead portion of the tape and compressing it against the gold bumps on a single die. The heat and pressure from the thermode liquifies the thickened solder on the lead, which then makes substantial contact with the surface area of the bump. Simultaneously, the heat from the thermode melts the wax holding the die to the glass slide, releasing it therefrom. After a predetermined contact time, the thermode automatically lifts from the tape, and the tape advances to the next frame. With the heat from the thermode removed, the solder solidifies against the bump and effectively bonds the die to the lead portion of the leadframe.

Figure 3B:
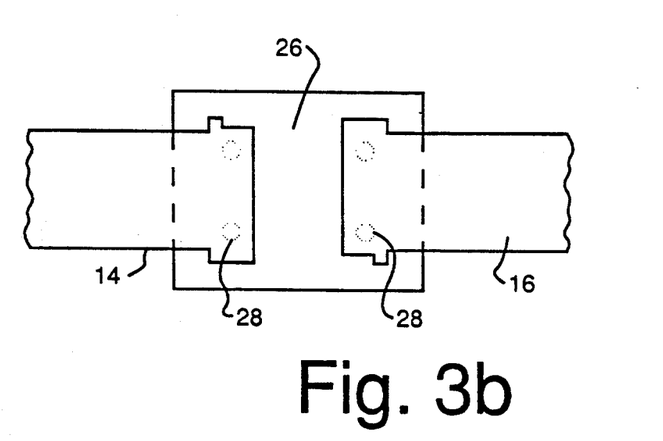
FIG. 3b is a top plan view of the "bumped" die as it appears mounted to the augmented and coated leads of the leadframe.

Referring now to FIG. 3b, shown is an exemplary lead-die assembly formed using the immediately above-described process. Lead 14 is bonded to die 26 via bumps 28 on the left side of the die, and lead 16 is bonded to die 26 via the bumps 28 on the right side of the die. To form these bonds, the heated thermode contacts leads 14 and 16 directly over die 26 and presses the leads onto the bumps. The heat from the thermode melts the solder that coats the leads, which subsequently envelops the bumps. When the thermode is removed, the solder solidifies and bonds the bumps and leads together. The tape periodically advances from frame to frame, and the process is successively repeated until each frame is complete.

Referring back to FIG. 2, the die 26, illustrated here by the round phantom figure, is disposed in its normal bonding position, over the leads 14 and 16. It can be seen that the bonding is performed while the leads are still attached to the tape 24, and that the tape can be mechanically advanced to another frame when the bonding operation is completed in the present frame. This facilitates total automation of the bonding process by presenting a continuous strip leadframe to the bonder, for pattern-recognition alignment relative to the associated die, and automatic thermal bonding of the die to the tape via the heated thermode.

The next step in the method of the present invention is injection molding the lead portion of the leadframe and attache die. This encapsulates the lead-die assembly and provides the assembly physical and electrical protection. Although transfer molding could be substituted in the overall process, injection molding was chosen based on the lower production costs made possible by injection molding's relatively short cycle time.

The injection molding process makes use of a multi-cavity mold made with hard steel inserts. The lead tape, on reels, and with the die attached, is automatically fed into the mold. Alternatively, an operator can manually ensure that the die fit securely within the mold cavities. The mold then closes with a clamping force of approximately 30 tons, and the injector mates to the mold at the parting line. Heated liquid plastic is then injected into the cold mold, and thereafter cooled. The entire molded unit is ejected from the mold as the mold opens, and the tape is then advanced. This cycle repeats until completion of the molding operation.

Figure 4A:
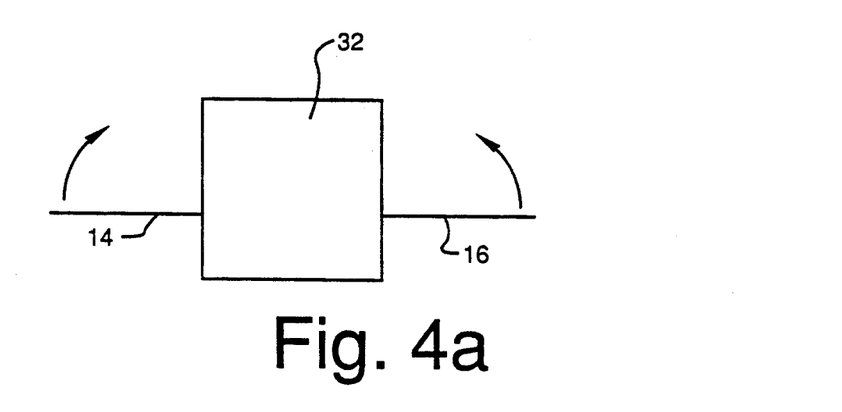
FIG. 4a is an elevational view of the cap formed around the die and lead portion of the leadframe by the injection molding process in accordance with the method of the present invention.

Shown in FIG. 4a is an illustration of a molded cap 32 formed by the injection molding process described immediately above. Die 26 (not shown) is bonded to leads 14 and 16 which project laterally outward from the sides of the cap and, although eventually bent upward in the direction of the arrows shown in the figure, are still flat, and remain, at this point, attached to the body of the leadframe (not shown in FIG. 4a).

Figure 4B:
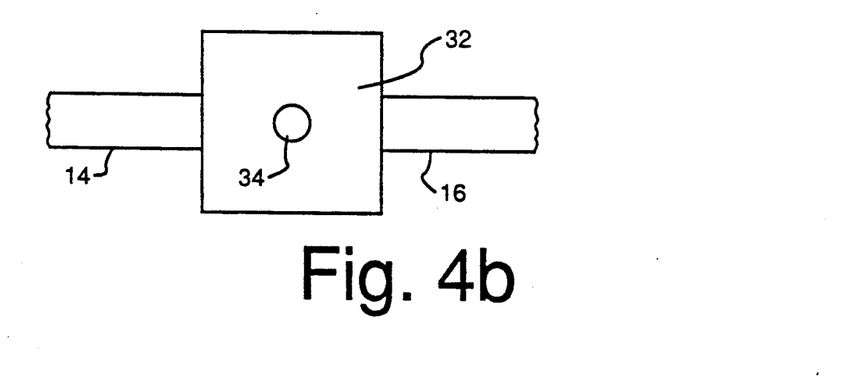
FIG. 4b is a bottom plan view of the cap formed by the injection molding process, illustrating the depression formed in the base thereof for receiving the cylindrical ferrite core in accordance with the method of the present invention.

FIG. 4b details the bottom view of molded cap 32, which includes an annular indentation 34. As will be described in detail below, cylindrical core 10 is secured within indentation 34 after the cap is separated from the leadframe.

The next step in the method of the present invention is separation of the caps from the leadframe. The plastic runners and gates are first trimmed from the body of the leadframe, leaving each encapsulated lead-die assembly still attached to the leadframe body by the leads. The caps are then mechanically stamped out of the leadframe, and the leads are formed, i.e., bent upward or downward as described above. Alternatively, the leads could be trimmed from the body of the leadframe at this point, whereby the caps would still be physically coupled to the leadframe body by the plastic runners and gates formed during the molding operation. Typically, this trimming and forming operation is done mechanically and is synchronized with the injection molding operation.

In either alternative, concurrent with separation, the caps are positioned within holders, and a ferrite core is attached to each cap. A predetermined amount of glue is automatically placed within the depression 34 formed in the base of each cap. A ferrite core is subsequently inserted into an individual depression, whereupon it is bonded therein. By way of specific example, individual cap 32, which encloses die 26 and portions of leads 14 and 16, is mechanically stamped out from the runners and gates holding it to the body of leadframe 24. While positioned within a holder, the leads are bent upward. A predetermined amount of adhesive is automatically deposited in depression 34 and core 10 is inserted therein. This process is repeated for each encapsulated lead-die assembly until a core has been attached to each individual cap. Alternatively, leads may be left attached to the leadframe until after the ferrite core is wound (discussed below), at which time the leads may be separated from the leadframe.

With the core now mounted to the cap base, the next step in the method of the present invention is coil winding and wire-to-lead attachment. Because of the fine size of the wire used in implantable transponder devices, i.e., on the order of a few to several microns, automated attachment of the wire ends to the die has been heretofore impracticable. In the prior art methods, manual wire manipulation and bonding is necessary to ensure that the proper connections are effectively made. However, according to the method of the present invention, these connections can be automated. By continuously dispensing the wire from a relatively small syringe-like tube, constant tracking of wire placement is realized during the full operation of lead bonding and coil winding. This tracking, in conjunction with the augmented solder-coated leads, accommodates full process automation, as described below.

Initially, wire 18 is held within the syringe-like tube and is placed against one of the upwardly bent leads protruding from the sides of the molded cap. An electrode automatically descends and presses wire 18 against this lead, liquefying the thick coating of solder thereon. When the electrode is automatically removed, after a predetermined contact time, the solder solidifies and physically bonds the wire to the lead. Because of the greater surface area of the lead as compared to a bonding pad directly on the die, and because the wire position is precisely known, this bonding process can be performed accurately and effectively, without operator intervention. Of course, alternative means for attaching the wire to the lead may be used. For example, if electric welding is used, thickened solder is not required.

After bonding wire 18 to the first lead, a flywheel is used for automatically "fly-winding" the wire around the ferrite core at a speed between 30,000 to 50,000 rpm. Winding at this speed is made possible by the lead bonding technique employed in the production process, and by the use of the narrow tube for the wire dispensation. Upon completion of the core winding, the free wire end unattached, still held end of wire 18 within the tube, is bonded to the second lead projecting from the cap in the same manner as described in connection with the first lead above. That is, the wire dispensing tube is placed next to the second lead, and an electrode automatically descends and bonds the wire to the augmented solder-coated lead. This again is made possible because the wire position is precisely known due to use of the syringe-like dispenser, and because of the expanded surface area available for bonding on the solder coated lead.

Figure 5:
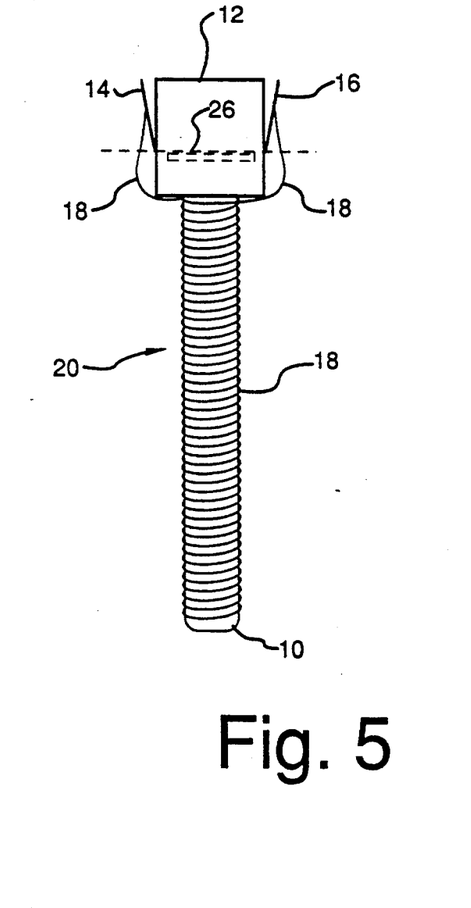
FIG. 5 is an elevational view of the fully assembled transponder device, detailing the fine wire connections and core winding placement in accordance with the method of the present invention.

By way of specific example, shown in FIG. 5 is an elevational view of the completed transponder device, before it is placed within the glass capsule 22. Leads 14 and 16 are bent upwards toward the sides of cap 12 as illustrated. Die 26 is encapsulated within cap 12, and is represented by the ghost outline in the figure. At the initiation of the coil winding operation, wire 18, held within the syringe-like dispenser (not shown), is connected to the augmented solder-coated lead 14 by an electrode which automatically descends and compresses the wire to the lead and bonds then together. Wire 18, still held within the dispenser, is then automatically fly-wound around core 10, and subsequently terminally connected to lead 16, once again, by the automatically descending electrode. At this point, the transponder 20 is fully assembled, and is ready for encapsulation within glass capsule 22.

As was fully detailed above, the method of the present invention provides for the fully automated manufacture of a small implantable passive transponder devices. By use of the wafer bumping process, and the thickened solder coating on the leadframe, conductive connection is made between the individual "bumped" die and the tape without the use of the fine wire connections necessary in prior art devices. This, in turn, facilitates the use of injection molding for the formation of the cap portion of the device, a faster and more cost-effective method of manufacture.

The thickened solder coating on the leads and the augmented lead surface areas are also conducive to automated connection of the fine core wire ends, something that could only be achieved manually in the prior art devices. Additionally, because the wire is dispensed from a specially designed syringelike tube, wire placement and winding can be fully tracked and fully automated, greatly enhancing production efficiency.

Whereas the preferred embodiment of the present invention has been described above, it is contemplated that other alternatives and modifications may become apparent to those skilled in the art after having read the above disclosure. It is, therefore, intended that the appended claims be interpreted as covering all such alterations and modifications as fall within the true spirit and scope of the invention.

What is claimed is:

1. An automated method for manufacturing a passive transponder device, comprising the steps of:
    attaching an individual identification device, including an individual identification integrated circuit means, to an individual site on a tape leadframe and electrically connecting said circuit means to the leads of said leadframe;
    injection molding a protective cap around said device such that a plurality of leads of said leadframe protrude form said cap;
    severing said plurality of leads to disassociate the encapsulated identification devices from said leadframe;
    attaching one end of an elongated ferrite core to said cap;
    winding a length of wire at high speed around said core to form an inductor; and connecting a first end of said wire to a first of one said plurality of leads and a second end of said wire to a second one of said plurality of leads using a automated connecting means.

2. A method as described in claim 1 wherein said integrated circuit means is provided with conductive bumps for connecting said individual identification circuit means to said leads by bonding said bumps thereto, and further for providing direct electrical coupling between said leads and said circuit means.

3. A method as described in claim 2 further comprising the step of:
    using an automated thermode means for attaching said devices to said leadframe and for bonding said conductive bumps to said leads.

4. A method as described in claim 2 wherein, prior to attachment of said identification device, said leadframe is coated with a thick coating of conductive material for enhancing the conductive connection between said leadframe and said bumps.

5. A method as described in claim 4 wherein said conductive material is solder.

6. A method as described in claim 4 further comprising the step of:
    using an automated thermode means for attaching said devices to said leadframe, said thermode means being operative to press said leadframe against said bumps and thermally liquify said conductive material such that said bumps are bonded to said leadframe as said material solidifies.

7. A method as described in claim 2 further comprising the step of:
    using an automated pattern recognition means for aligning said conductive bumps with the leads of said leadframe.

8. A method as described in claim 1 wherein said leadframe is provided with leads having an enlarged surface area for facilitating automated connection between said leads and said wire.

9. A method as described in claim 1 wherein said molding step includes providing an indentation in said cap, and further wherein, prior to attaching said core, an adhesive material is deposited in said indentation and thereafter said core is positioned within said indentation, said core being affixed to said cap by said adhesive material.

10. A method as described in claim 1 further comprising the step of:
    using a tubular applicator to dispense said wire, said applicator causing said wire to be accurately positioned during said winding and said connecting.

11. A method as described in claim 10 wherein said wire is first connected to a said first lead protruding from said cap, then wound around said core, and subsequently connected to said second lead protruding from said cap.

12. A method as described in claim 11 wherein connection of said wire to said first lead and said second lead is accomplished using an automated thermode means.

13. A method as described in claim 12 wherein said thermode means is accurately positioned for bonding said wire to said leads using an automated pattern recognition means.

14. A method as described in claim 10 wherein said wire is wound around said core using an automated fly-winding means.

15. A method as described in claim 14 wherein said wire is wound around said core at a speed between 30,000 to 50,000 rpm.

16. An automated method for manufacturing passive transponder devices, comprising the steps of:
  preparing a plurality of raised bonding areas on the contact pads of individual identification die;
  preparing a leadframe with leads having an enlarged surface area;
  coating the surface of a said leadframe with a thick layer of conductive solder;
  bonding said die to a plurality of separate bonding sites on said leadframe using a fully automated thermode means, said thermode means being operative to press said augmented leads against said bonding areas at each said site whereby the heat from said thermode liquefies said conductive solder and further whereby said bonding areas are effectively conductively connected to said leads at each said site when said thermode is removed and said solder solidifies;
  injection molding protective cap around each said site with said die attached such that plurality of said leads protrude laterally from each said cap;
  singulating said caps from said leadframe using an automatic singulating means;
  attaching an elongated cylindrical ferrite core to each said cap using an automatic attaching means;
  applying a fine conductive wire to a first lead protruding from a first said cap using an automatic applicator means;
  bonding said wire to said first lead using an automatic electrode means;
  winding said wire, still within said applicator means, at high speed around the length of said core using an automatic fly winding means;
  applying said wire to a second lead protruding from said first cap using said automatic applicator means; and,
  bonding said wire to said second lead using said automatic electrode means.

17. A method as described in claim 16 further comprising the step of:
  using an automated pattern recognition means for aligning said raised bonding areas with said bonding sites such that proper attachment is made therebetween by said thermode means.

18. A method as described in claim 16 further comprising the step of:
  using an automated pattern recognition means for positioning said applicator means and said wire against said leads such that proper bonding is made between said wire and said leads by said automatic electrode means.

19. A method as described in claim 16 wherein said wire is wound around said core at a speed between 30,000 to 50,000 rpm.

* * * * *